(12) United States Patent
Fuechsle et al.

(10) Patent No.: US 9,396,848 B2
(45) Date of Patent: Jul. 19, 2016

(54) DEVICE WITH OVERVOLTAGE PROTECTION AND METHOD FOR ITS TESTING

(75) Inventors: Dieter Fuechsle, Endingen (CH); Daniel Neeser, Thalwil (CH); Bernhard Doser, Waldshut-Tiengen (DE); Daniel Müller, Zürich (CH); Marlene Ljuslinder, Ennetbaden (CH); Felix Greuter, Baden-Rütihof (CH)

(73) Assignee: ABB Research Ltd, Zurich (CH)

( * ) Notice: Subject to any disclaimer, the term of this patent is extended or adjusted under 35 U.S.C. 154(b) by 622 days.

(21) Appl. No.: 13/326,942

(22) Filed: Dec. 15, 2011

(65) Prior Publication Data

US 2012/0153976 A1    Jun. 21, 2012

(30) Foreign Application Priority Data

Dec. 16, 2010 (EP) .................................... 10195286

(51) Int. Cl.
| | |
|---|---|
| *H02H 1/00* | (2006.01) |
| *H01C 7/12* | (2006.01) |
| *G01R 31/02* | (2006.01) |
| *H02H 3/04* | (2006.01) |
| *H02G 13/00* | (2006.01) |

(52) U.S. Cl.
CPC .............. *H01C 7/12* (2013.01); *G01R 31/021* (2013.01); *H02G 13/80* (2013.01); *H02H 3/048* (2013.01)

(58) Field of Classification Search
USPC ................................................ 361/117–120
See application file for complete search history.

(56) References Cited

U.S. PATENT DOCUMENTS

| | | | | |
|---|---|---|---|---|
| 4,174,530 A | * | 11/1979 | Kresge et al. | ................. 361/127 |
| 4,389,693 A | * | 6/1983 | Yanabu et al. | ................. 361/127 |
| 4,663,692 A | * | 5/1987 | Carothers et al. | ............. 361/117 |
| 6,049,049 A | | 4/2000 | Lindberg | |
| 7,312,970 B2 | | 12/2007 | Skinner | |

(Continued)

FOREIGN PATENT DOCUMENTS

| | | |
|---|---|---|
| CN | 1638225 A | 7/2005 |
| EP | 1 603 141 A1 | 12/2005 |

OTHER PUBLICATIONS

European Search Report issued on May 16, 2011 (with English language translation of category of cited documents).

(Continued)

*Primary Examiner* — Danny Nguyen
(74) *Attorney, Agent, or Firm* — Taft Stettinius & Hollister LLP

(57) ABSTRACT

Exemplary embodiments are directed to a device with overvoltage protection that includes a varistor which can be connected by a first connection via a first line to high-voltage potential in a circuit arrangement, while a second connection is connected to ground via a second line. Furthermore, an additional impedance is provided, which can be connected between the second connection and ground or the first connection and the high voltage, or is mounted fixed in this position. The corresponding line can be interrupted by a switching arrangement. In order to test the withstand voltage of the circuit arrangement, at least one of the first and second line is interrupted and an additional impedance is inserted. A test voltage is applied to the circuit arrangement. After the overvoltage test, the interruption in at least one of the first and second lines is removed again.

12 Claims, 10 Drawing Sheets

(56) References Cited

U.S. PATENT DOCUMENTS

| | | |
|---|---|---|
| 7,369,390 B2 | 5/2008 | Doser et al. |
| 8,199,452 B2 * | 6/2012 | Kruska et al. ............... 361/117 |
| 2005/0152085 A1 | 7/2005 | Skinner |
| 2005/0270719 A1 | 12/2005 | Doser et al. |

OTHER PUBLICATIONS

Chinese Office Action (First Office Action) dated Dec. 19, 2013, issued by the State Intellectual Property Office of the Peoples's Republic of China in corresponding Chinese Patent Application No. 201110438803.1, and partial English language translation of Office Action. (15 pages).

\* cited by examiner

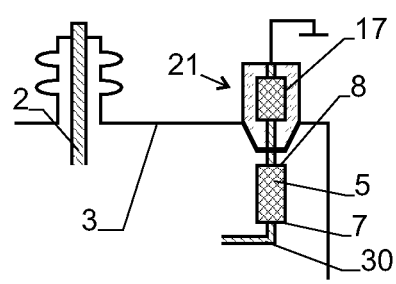
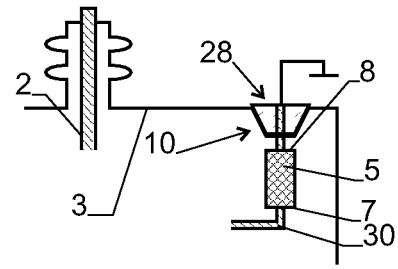
Fig. 14     Fig. 15
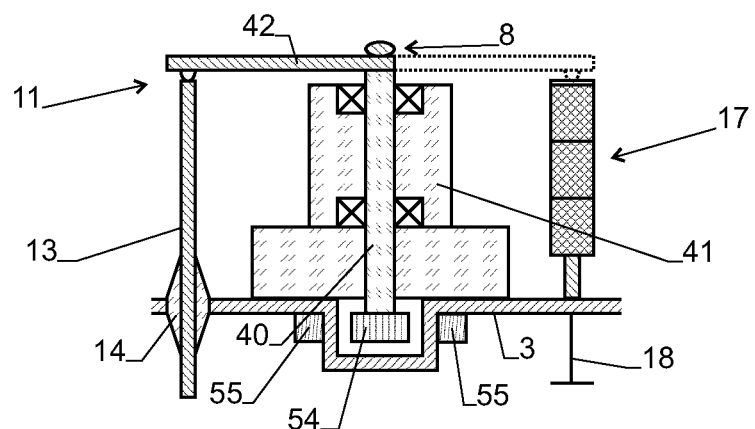
Fig. 16

DEVICE WITH OVERVOLTAGE PROTECTION AND METHOD FOR ITS TESTING

RELATED APPLICATION

This application claims priority under 35 U.S.C. §119 to European Patent Application No. 10195286.9 filed in Europe on Dec. 16, 2010, the entire content of which is hereby incorporated by reference in its entirety.

FIELD

The invention relates to overvoltage protection, such as a method for carrying out an overvoltage test in a circuit arrangement to which at least one surge arrester is connected.

BACKGROUND INFORMATION

In known high-voltage systems, surge arresters can be used to dissipate unacceptable overvoltages to ground. Surge arresters such as these can include a varistor which has a high impedance at relatively low voltages, but which starts to conduct at unacceptable overvoltages, and is thus able to limit the overvoltage.

During a test phase, a test voltage can be connected to the system and a check is carried out to determine whether the system can withstand this voltage. In this case, care must be taken to verify that a surge arrester which is connected to the high-voltage system does not respond to the test voltage, because it could otherwise limit the test voltage, or could be damaged by the test voltage. Surge arresters are therefore normally removed during the test phase.

Particularly in the case of gas-insulated fittings, in which the high-voltage systems and the surge arresters are gas-insulated, removal of the surge arrester in order to carry out an overvoltage test is, however, extremely complex.

SUMMARY

An exemplary method for carrying out an overvoltage test in a circuit arrangement to which at least one surge arrester is connected is disclosed, wherein the surge arrester has a varistor, which is connected to high-voltage potential via a first line at a first connection and to ground via a second line at a second connection during normal operation, and wherein, during a test phase, a test voltage is applied to the circuit arrangement, the method comprising: before the test phase, interrupting at least one of the first and second lines; during the test phase, maintaining the first connection to the circuit arrangement and connecting the second connection to ground via an additional impedance, or connecting the first connection to the circuit arrangement via the additional impedance and maintaining the second connection to ground, or connecting the first and the second connection to ground and to the circuit arrangement via a respective additional impedance, wherein the additional impedance has a higher impedance than the interrupted line; and after the test phase, removing the interruption of at least one of the first and second lines.

An exemplary device having overvoltage protection for carrying out an overvoltage test in a circuit arrangement to which at least one surge arrestor is connected is disclosed, the device comprising: a varistor which can be connected to high-voltage potential at a first connection and can be connected to ground at a second connection; a first line, via which the first connection can be connected to the high-voltage potential; and a second line, via which the second connection can be connected to ground; wherein at least one additional impedance, which has a higher impedance than the first or second line and which can be arranged between the first connection and the high voltage, and/or between the second connection and ground.

BRIEF DESCRIPTION OF THE DRAWINGS

Further refinements, advantages and applications of the invention will become evident from the dependent claims and from the description which now follows, with reference to the figures, in which:

FIG. 14 shows a high-voltage device with an integrated surge arrester during the test phase in accordance with an exemplary embodiment;
FIG. 15 shows the high-voltage device of FIG. 14 during normal operation in accordance with an exemplary embodiment;
and
FIG. 16 shows a variant of a fifth arrangement of a surge arrestor relating to FIG. 5 in accordance with an exemplary embodiment.

DETAILED DESCRIPTION

Figure 1:
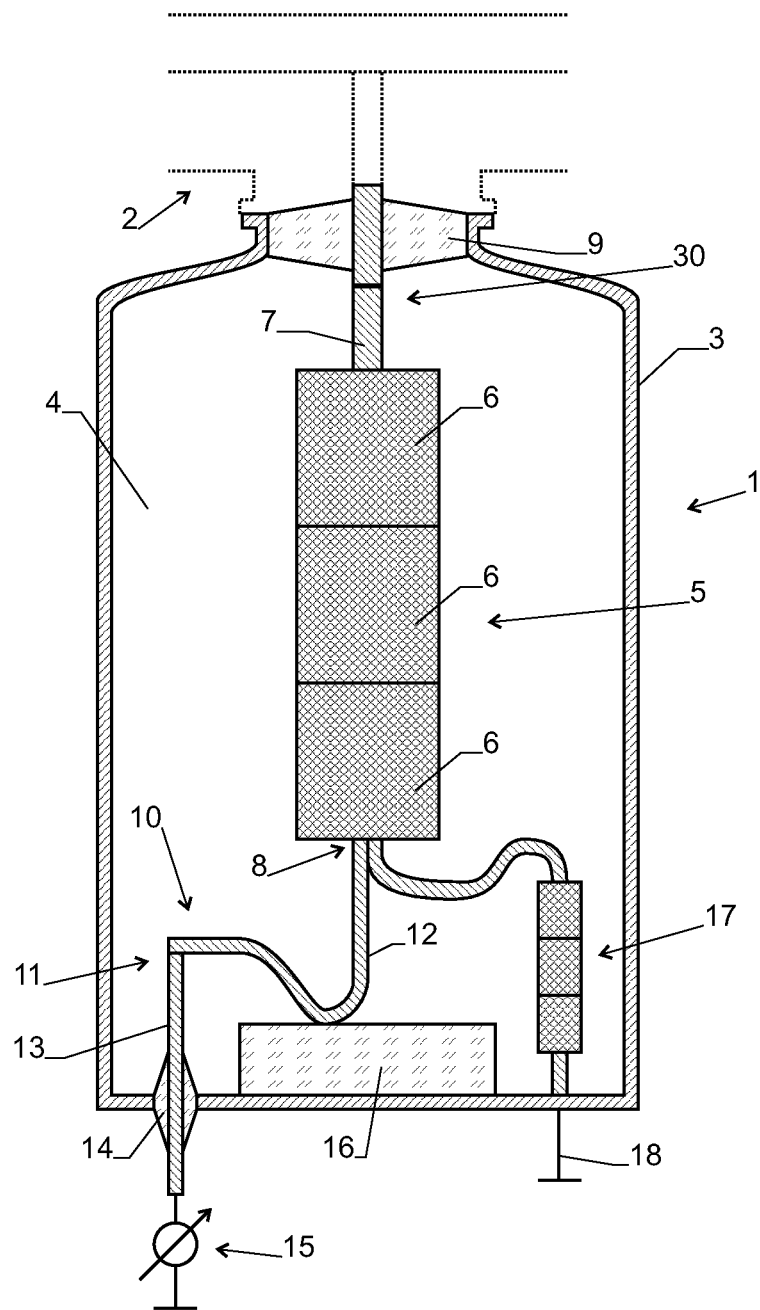
FIG. 1 shows a first arrangement of a surge arrester in accordance with an exemplary embodiment.

Exemplary embodiments of the present disclosure provide a method and a device of the type mentioned initially which allow the overvoltage test to be carried out more easily.

An exemplary embodiment of the present disclosure relates to a method for carrying out an overvoltage test in a circuit arrangement to which at least one surge arrester is connected. This surge arrester has a varistor which is connected to high-voltage potential via a first line at a first connection, and can be connected to ground via a second line at a second connection. During a test phase, a test voltage is applied to the circuit arrangement. In order to prevent the varistor from responding to the test voltage, the following steps can be performed.

Before the test phase, the first or second line is interrupted.

During the test phase, one of the following steps is used, depending on whether the first or the second line was interrupted first:

a) If the second line (on the ground side) was interrupted first, then the first connection remains connected to the circuit arrangement, while the second connection is connected to ground via an additional impedance.

b) If the first line (on the high-voltage side) was interrupted first, then the second connection remains connected to ground, while the first connection is connected to the circuit arrangement, e.g., high voltage, via the additional impedance.

In both cases, the additional impedance has a higher impedance than the interrupted line.

After the test phase, the interruption of the first and/or second lines/line are/is removed again, as a result of which the surge arrester resumes its normal protective function.

The additional impedance can be used to build up a sufficiently high impedance together with the varistor during the test phase that the surge arrester does not respond, which could lead to overloading, or to limiting of the test voltage. In contrast to known solutions, there is, however, no need to completely decouple the varistor from the high voltage.

The second line (on the ground side) can be interrupted, and the additional impedance can be arranged between the second connection and ground. In this case, the additional impedance can make it possible to reduce the potential at the ground-side of the second connection of the varistor in comparison to the test voltage during the test phase, thus preventing a flashover in this area.

According to an exemplary embodiment, the device includes a varistor, a first line, and a second line.

The varistor can be used in a known manner to dissipate overvoltages, that is to say its impedance decreases sharply above a limit voltage. It has a first connection via which it is connected to high-voltage potential, as well as a second connection, in order to connect it to ground.

The first line can be provided in order to connect the first connection to high-voltage potential.

The second line can be provided in order to connect the second connection to ground, that is to say ground potential.

Furthermore, an additional impedance can be provided, which has a higher impedance than the first or second line and which can be arranged between the first connection and the high voltage, or between the second connection and ground. The additional impedance increases the impedance of the surge arrester during the test phase in the manner described above.

A device of this type may, for example, be a surge arrester or an appliance which contains a surge arrester such as this, for example a bushing with overvoltage protection.

A mechanical switching arrangement can be provided for interrupting the first or second line during the test phase in a simple manner.

The arrangement of the additional impedance between the second connection and ground can be established, with the switching arrangement allowing the second line to be interrupted. In other words, in this exemplary embodiment, the additional impedance can be inserted on the ground side in series with the varistor. In another exemplary embodiment, arrangement on the high-voltage side of the varistor is also possible, in which case the switching arrangement can interrupt the first line. Furthermore, it is also feasible to arrange an additional impedance on the ground side and another additional impedance on the high-voltage side, in which case the switching arrangement can interrupt the first and the second line.

The additional impedance is advantageously of such a size that, during the test phase, the voltage drop across the varistor does not exceed a maximum permissible varistor voltage for a determined test duration, even when the test voltage is higher than the varistor maximum voltage. This arrangement can allow the varistor to not draw current excessively.

In another exemplary embodiment, the additional impedance and the switching arrangement can be arranged in the encapsulation. This arrangement can allow dispensing with a voltage-resistant bushing, and, furthermore, the inert gas which is arranged in the encapsulation can also prevent flashovers in the area of the additional impedance.

Alternatively, the additional impedance can also be arranged outside the encapsulation. In this case, it is advantageous to have a ground connection which is connected to the second connection (on the ground side) of the varistor, and which extends through an insulating bushing on the encapsulation. The arrangement of the additional impedance outside the encapsulation allows easier accessibility. Furthermore, in this case, it is possible to remove the additional impedance easily, when it is no longer specified after the test phase.

In this case, for gas-insulated devices, "encapsulation" means gas-tight encapsulation which surrounds the insulating gas. Otherwise, the term encapsulation means a housing or outer surface of the device. However, exemplary embodiments disclosed herein can also be used for liquid-insulated or solid-insulated parts.

Figure 3:
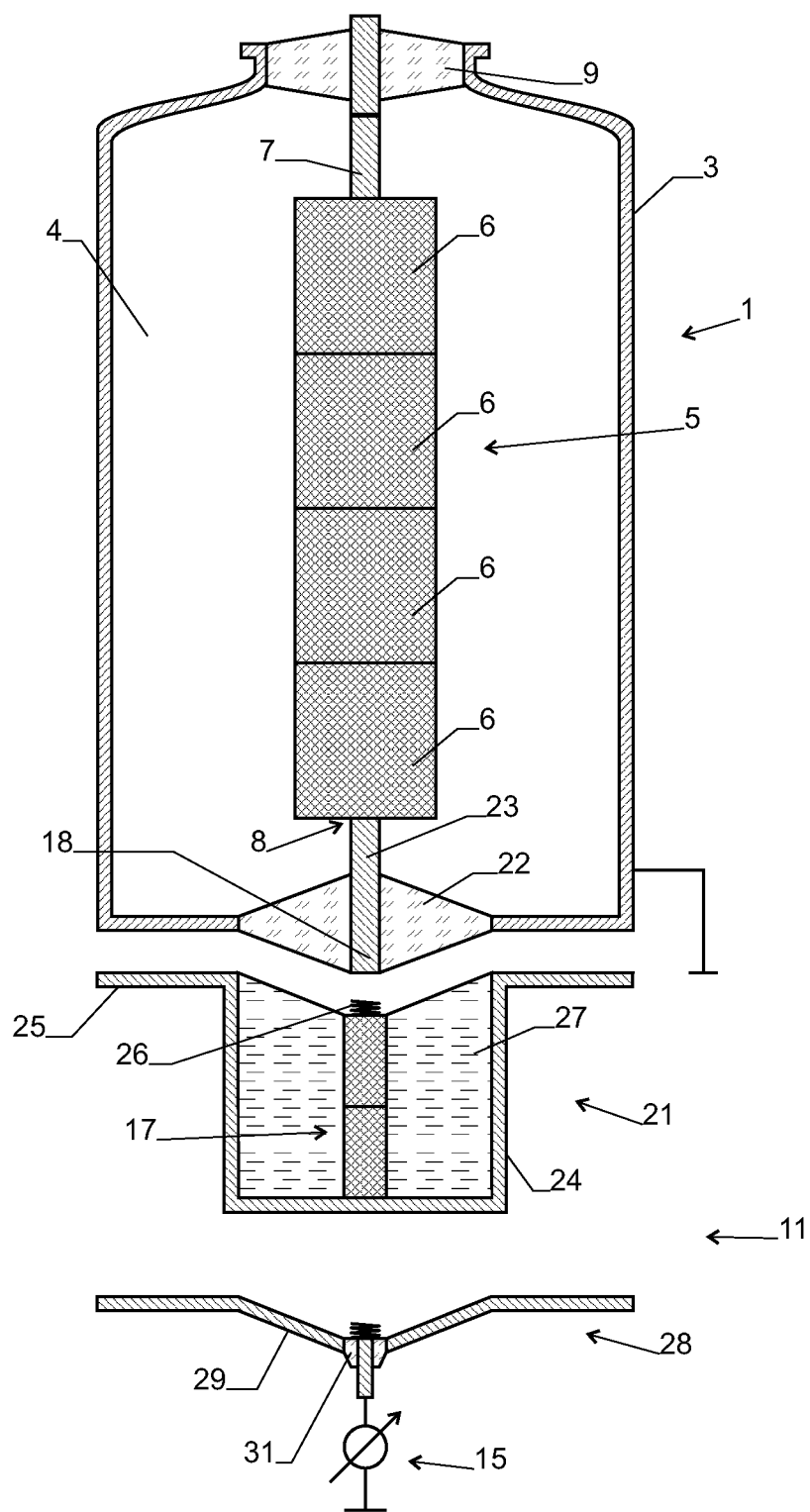
FIG. 3 shows a third arrangement of a surge arrester in accordance with an exemplary embodiment.

The term "mechanical switching arrangement" in the present context means that it covers both an actual switch as well as a disconnecting mechanism which makes it possible to interrupt the first and/or second lines/line by fitting and/or removing parts of the surge arrester, for example in the sense of the embodiment as shown in FIG. 3, which is described below.

The exemplary embodiments of the present disclosure can be applied particularly advantageously to a gas-insulated, liquid-insulated or solid-insulated circuit arrangement with a gas-insulated, liquid-insulated or solid-insulated surge arrester, since in this case it will be particularly complex to remove the surge arrester for the test phase. However, the principle according to the exemplary embodiments disclosed herein also applicable in the same sense to other surge arresters, and also to circuit arrangements which are not gas-insulated, liquid-insulated or solid-insulated.

FIG. 1 shows a first arrangement of a surge arrester in accordance with an exemplary embodiment. FIG. 1 shows a gas-insulated surge arrester 1, which is connected to a likewise gas-insulated circuit arrangement 2 as illustrated by dashed lines. The circuit arrangement 2 can be any arrangement which carries high voltage, for example a gas-insulated switch, a transformer or some other appliance. The switching arrangement 2 can be designed for DC voltage, AC voltage or superimpositions thereof, and for other voltage forms.

The surge arrester 1 has gas-tight encapsulation 3 composed of metal, whose internal area 4 is filled with a pressurized inert gas, for example $SF_6$. A varistor 5 is arranged in the encapsulation 3. This varistor, which is composed of one or more individual bodies 6, forms a voltage-dependent impedance, for example based on metal oxide, in particular suitably doped ZnO. The individual bodies 6 can be mechanically and electrically connected to one another in a known manner.

The varistor 5 has a first connection 7 on the high-voltage side, and a second connection 8 on the ground side. The first connection 7 can be connected to the circuit arrangement 2 via a first line 30 through an insulating bushing 9. The second connection 8 can be connected to ground, that is to say to ground potential, via a second line 10 (also referred to as a ground line) and a mechanically operable switching arrangement 11.

In the illustrated embodiment, the ground line 10 includes a conductor section 12 composed of metal, as well as a metal pin 13. The metal pin 13 is arranged such that it can be moved longitudinally in a gas-tight, electrically insulating bushing 14. Its outer end is connected to ground via an optional measurement instrument 15.

The conductor section 12 and the metal pin 13 together form a switch, which is arranged in the encapsulation 3, in the switching arrangement 11, by means of which the ground line 10 can be interrupted. When the metal pin 13 is in the position shown in FIG. 1, the ground line 10 is not interrupted. However, if it is partially withdrawn, such that it breaks contact with the conductor section 12, the ground line 10 is interrupted.

The switch which is formed by the metal pin 13 and the conductor section 12 can therefore be operated through the encapsulation 3, in such a way that the ground line 10 can be interrupted without having to open the encapsulation 3. However, this switch can also be configured in a different manner. For example, a different type of movable element can be provided, which extends through a bushing in the encapsulation and is held movably therein, and by means of which the switch can be operated. This movable element can at the same time form part of the ground line 10, as shown in the embodiment in FIG. 1, although it can also be an insulating element, which does not itself form part of the ground line 10. Further refinements of the switch 11 will be described further below with reference to the other exemplary embodiments.

As FIG. 1 also shows, an electrically insulating body 16 is additionally provided between the second connection 8 of the varistor 5 and the encapsulation 3, on which electrically insulating body 16 the conductor section 12 and the varistor 5 are mechanically supported in the disclosed embodiment.

Furthermore, an additional impedance 17 is connected to the second connection 8. This additional impedance 17 is in the form of a resistor or a capacitor, or a mixture thereof. In other words, the impedance value of the additional impedance is therefore capacitive and/or resistive. The impedance value advantageously decreases as the voltage increases. By way of example, the additional impedance 17 can be produced from the same material as, or a similar material to, the varistor 5. However, it need be designed only for lower power and current levels than the varistor 5, since the additional impedance is subject to significant voltage only during the test phase, which is described further below, but not during normal operation.

The additional impedance is electrically arranged between the second connection 8 of the varistor 5 and a ground connection 18 of the surge arrester 1. By way of example, the ground connection 18 is formed by the encapsulation 3.

The following text now describes how an overvoltage test can be carried out on a circuit arrangement 2 having a surge arrester 1 of the type illustrated in FIG. 1. The same method can essentially also be used for the further embodiments of the surge arrester 1, which are described further below.

In order to carry out an overvoltage test, the ground line 10 is first of all interrupted, before the actual test phase. In the exemplary embodiment shown in FIG. 1, this is done by pulling the metal pin 13 sufficiently far outward that it breaks contact with the conductor section 12 and is moved sufficiently far away from it that the switching arrangement 11 interrupts the ground line 10, without any flashover, for the voltages which then occur.

The actual test phase then takes place. In this test phase, a test voltage is applied to at least some of the live parts of the circuit arrangement 2, and this test voltage is above the nominal voltage thereof. If, for example, the nominal voltage is 420 kV phase-to-phase or 242 kV phase-to-ground, then a test voltage of 515 kV phase-to-ground, for example, is applied.

This test voltage of 515 kV would intrinsically considerably exceed the maximum continuous voltage of the varistor 5 which, for example, is 317 kV. However, since the ground line 10 is now interrupted, the varistor 5 and the additional impedance 17 form a voltage divider, as a result of which only a portion of the test voltage is dropped across the varistor 5. Specifically, in this case, the additional impedance 17 is of such a size that the voltage drop across the varistor 5 when the test voltage is applied does not exceed the maximum permissible voltage on the varistor 5 for the test duration. In the above numerical example, at least 198 kV would therefore have to be dropped across the additional impedance 17, that is to say the additional impedance 17 must not have an excessively low impedance value.

On the other hand, the impedance value of the additional impedance 17 should also not be too great since, otherwise, the voltage drop between the second connection 8 and ground would become too high, and discharges could occur in the lower part of the surge arrester, for example across the switching arrangement 11.

At the end of the test phase, the test voltage is now removed from the circuit arrangement 2. After the test phase, the interruption of the ground line 10 can then be removed again by closing the switching arrangement 11 by insertion of the metal pin 13. Normal operation of the circuit arrangement 2 can now start. Since, in this case, the additional impedance is virtually shorted via the switching arrangement 11 and the ground line 10, any overvoltages which can occur are present in their entirety across the varistor 5, while the additional impedance 17, which is of weaker design, is not loaded.

Figure 2:
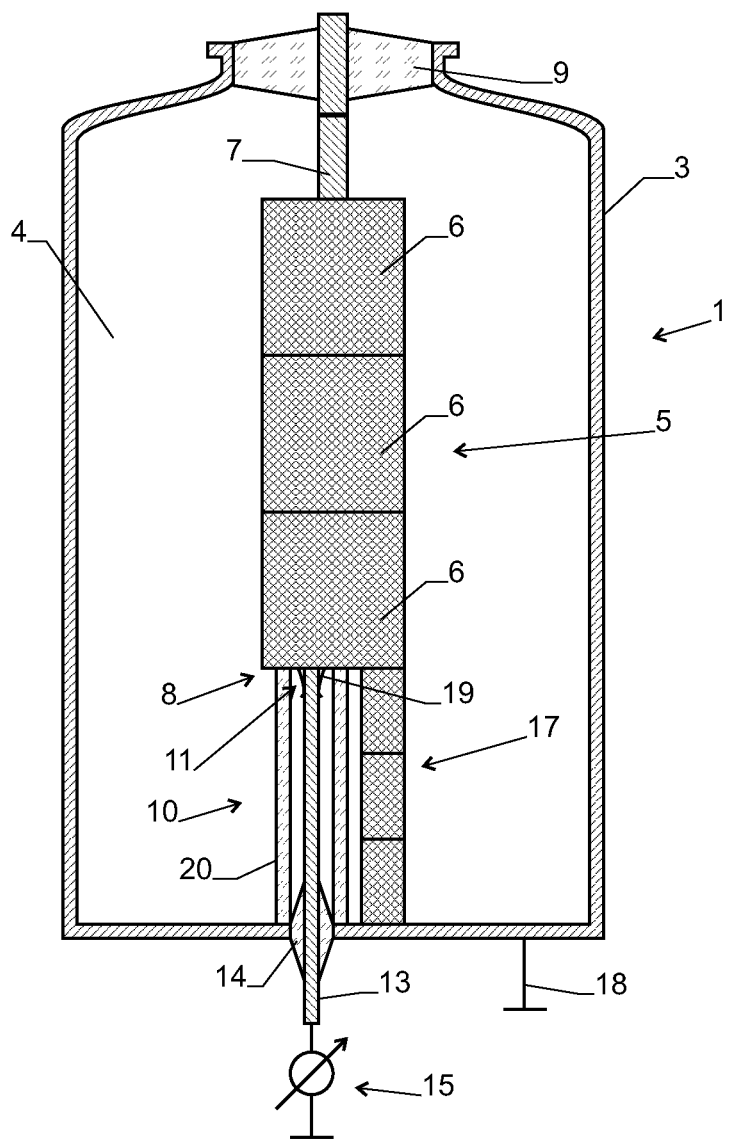
FIG. 2 shows a second arrangement of a surge arrester in accordance with an exemplary embodiment.

FIG. 2 shows a second arrangement of a surge arrester in accordance with an exemplary embodiment. This embodiment differs from the embodiment shown in FIG. 1 in the design of the lower part, in particular in the arrangement of the additional impedance 17 and of the ground line 10 as well as the switching arrangement 11.

First of all, in contrast to FIG. 1, the additional impedance 17 is connected directly to the second connection 8 and to the lower end of the varistor 5, and extends between the varistor 5 and the grounded base of the encapsulation 3.

In addition, the metal pin 13 makes contact with the second connection 8 directly or via a simple contact mechanism 19, as a result of which the switching arrangement 11 is formed between the second connection 8 and the metal pin 13. Once again, the metal pin 13 is held such that it can be moved longitudinally in a gas-tight, electrically insulting bushing 14 in the encapsulation 3, as a result of which it can be partially pulled out of the encapsulation, in order to open the switching arrangement 11.

An insulating supporting body 20 can be arranged around the metal pin 13, and connects the lower end of the varistor 5 to the base of the encapsulation 3.

The method of operation of the embodiment shown in FIG. 2 corresponds essentially to that shown in FIG. 1. For the test phase, the metal pin 13 is therefore partially pulled out of the encapsulation 3, as a result of which the ground line 10 is interrupted. The additional impedance 17 now reduce the voltage across the varistor 5, and the test voltage can be applied.

FIG. 3 shows a third arrangement of a surge arrester in accordance with an exemplary embodiment. In the exemplary embodiment of FIG. 3, the additional impedance 17 is arranged outside the encapsulation 3. It is integrated in an additional module 21, which is specified only during the overvoltage tests. During normal operation, the additional module 21 is replaced by a grounding element 28.

In order to allow the voltage to be passed to the exterior from the second connection 8 during the test phase without flashovers, a high-voltage bushing 22 can be provided in the encapsulation 3, in particular in its base, through which high-voltage bushing 22 a conductor 23 extends from the second connection 8 to the ground connection 18, and which forms an external cone on the outside of the encapsulation 3. In contrast to the bushing 14 shown in the embodiments in FIGS. 1 and 2, the high-voltage bushing 22 should be able to withstand the voltage at the second connection 8 during the test phase. On the other hand, the conductor 23 can be held fixed in the high-voltage bushing 23—there is no need for a capability to be moved or to be displaced, as in the case of the metal pin 13 in the bushing 14 in the embodiment shown in FIG. 1 or 2. In addition, the internal area 4 can be kept minimal.

The additional module 21 can be designed in various ways and, in FIG. 3 by way of example, has a cap 24 composed of metal. A flange 25 on the cap 24 can be connected to the base of the encapsulation 3, via attachment means which are not illustrated, during the test phase. A space for holding the additional impedance 17 is provided in the cap, to be precise such that the additional impedance 17 extends between the cap 24 and the ground connection 18 when the additional module 21 has been assembled. In order to establish a good contact between the additional impedance 17 and the ground connection 18, a suitable sprung contact element 26 can be provided.

The space at the side between the additional impedance 17 and the cap 24 is advantageously filled with an insulation means 27. This can be silicone or a gel. It is also feasible to use insulation filled with inert gas (for example $SF_6$).

The grounding element 28 is formed essentially by a metal plate 29, which can be fitted to the surge arrester 1 instead of the additional module 21. The shape of the grounding element 28 is chosen such that, after it has been fitted, it is connected to the ground connection 18, covers it, and then connects it to ground, for example optionally also via a bushing 31 and the measurement instrument 15, or via the encapsulation 3.

In the exemplary embodiment of FIG. 3, the grounding element 28 and the additional impedance 17 can therefore be connected alternatively to the ground connection 18.

Before the test phase, the grounding element 28 can be removed from the surge arrester 1 and replaced by the additional module 21 such that, when the test voltage is applied, the voltage divider which has been described above and includes (e.g., consists of) the varistor 5 and the additional impedance 17 is created to ground, and the additional impedance 17 can accept a portion of the voltage. After the test phase, the additional module 21 is removed and, for example, can be returned to the manufacturer since it is not specified during normal operation. Instead of the additional module 21, the grounding element 28 is fitted and now, together with the conductor 23, forms an electrical connection from the second connection to ground.

Therefore, FIG. 3 shows that the ground line is therefore formed by the conductor 23 and the grounding element 28. This ground line can be interrupted by removing the grounding element 28, as a result of which the grounding element 28 can also be referred to as a mechanical switching arrangement, by means of which the ground line can be interrupted.

Figure 4:
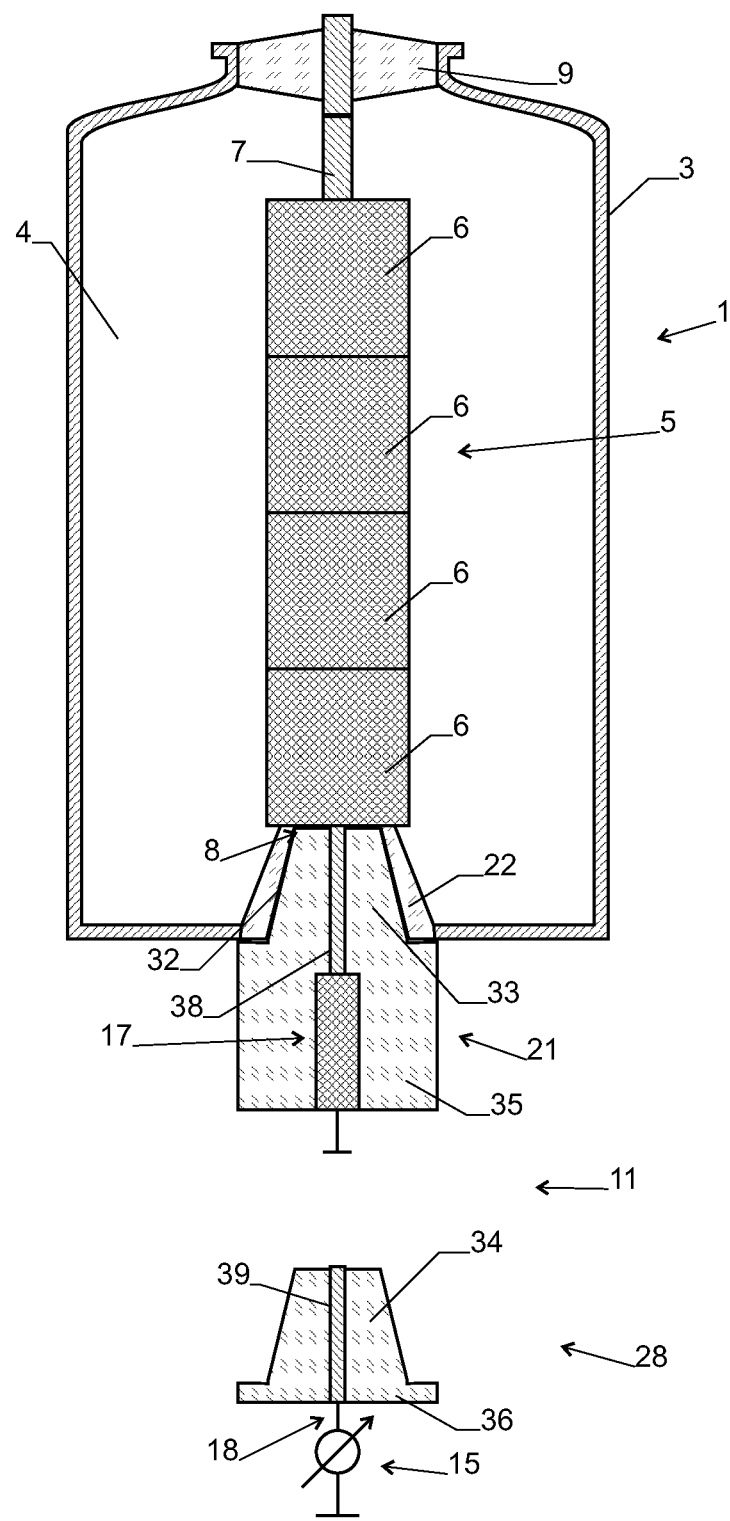
FIG. 4 shows a fourth arrangement of a surge arrester in accordance with an exemplary embodiment.

FIG. 4 shows a fourth arrangement of a surge arrester in accordance with an exemplary embodiment. As shown in FIG. 4, a depression 32 (in the form of an internal cone) toward the varistor 5 is formed on the lower face of the surge arrester 1, into which depression 32 the additional module 21 or the grounding element 28 can be inserted. Instead of the depression 32, it is also possible to provide an external contour which projects outward, for example in the form of an external cone, on which the additional module 21 is seated.

In this case, the additional module 21 has a tab 33 which fits into the depression 32, and the grounding element 28 has a tab 34, which likewise fits into the depression 32. The tab 33 or 34 is formed by a respective insulator 35 or 36. The insulator 35 or 36 can optionally be shielded in the area outside the encapsulation 3.

A conductor 38 to the additional impedance 17 extends through the insulator 35 of the additional module 21. A conductor 39 to the ground connection 18 extends through the insulator 36 of the grounding element 28.

In the embodiment shown in FIG. 4, the conductor 38 is illustrated as being straight, and the insulator 36 is illustrated as being rotationally symmetrical, that is to say the additional module 21 has a straight shape. However, depending on the specification, the additional module 21 may also, for example, be L-shaped, with a body which is angled through 90° with respect to the tab 33, or the additional module 21 may be a flexible piece of cable, or may contain such a flexible piece of cable. This also applies to the grounding element 38.

In the embodiment shown in FIG. 4, a plug output conductor of a known type, for example, can be used as the additional module 21.

Figure 5:
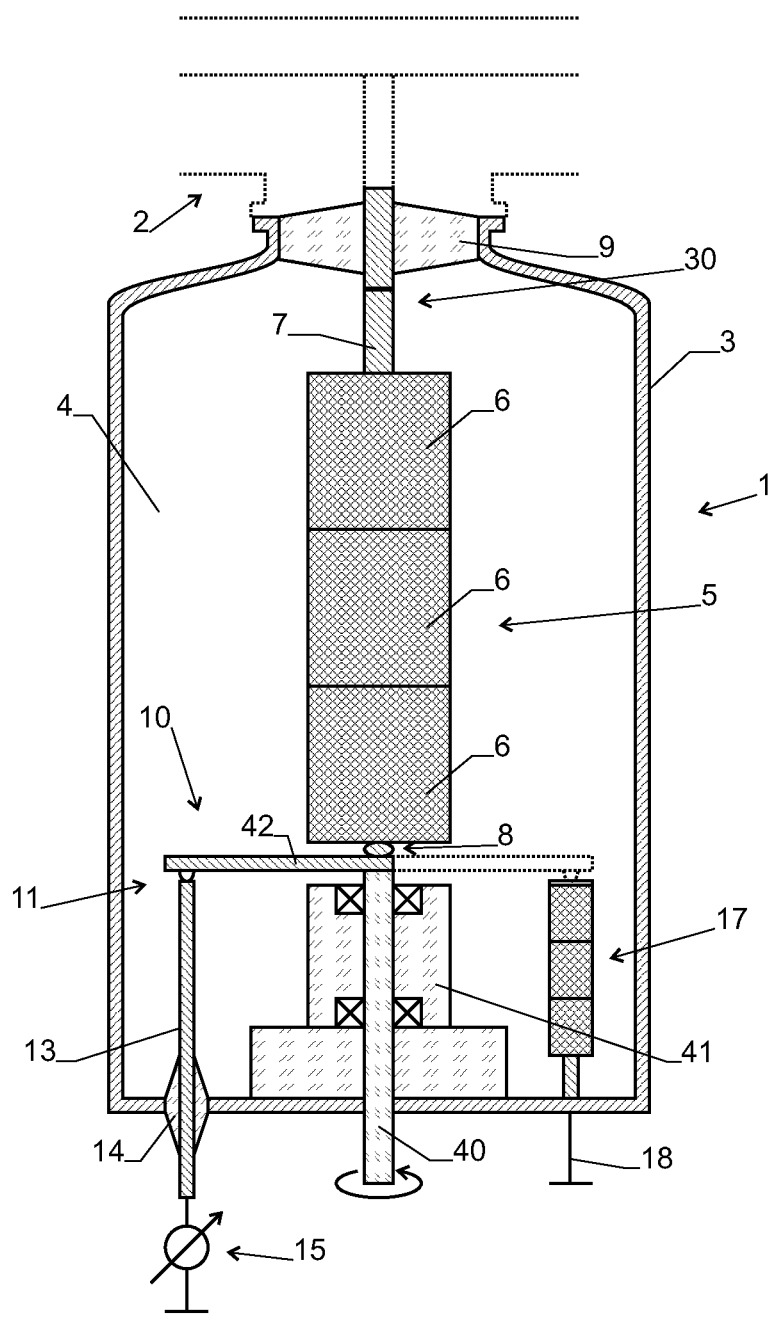
FIG. 5 shows a fifth arrangement of a surge arrester with rotary switch in accordance with an exemplary embodiment.

FIG. 5 shows a fifth arrangement of a surge arrester with rotary switch in accordance with an exemplary embodiment. As shown in FIG. 5, the switching arrangement 11 is in the form of a rotary switch. For this purpose, a bushing for an operating element 40 is provided on the lower face of the encapsulation 3, which operating element 40 is held in a gas-tight rotating bearing 41 such that it can rotate about its longitudinal axis. An electrically conductive pivoting arm 42 is attached to the inner end of the operating element 40 and is connected rotatably to the second connection 8 of the varistor, at a first end, and its second end can be pivoted backward and forward between the metal pin 13 and the additional impedance 17, in order to make a contact in each case there. FIG. 5 illustrates the pivoting arm 42 in that position in which it makes contact with the metal pin 13, while the position in which it makes contact with the additional impedance is illustrated by dashed lines.

FIG. 16 shows a variant of a fifth arrangement of a surge arrestor relating to FIG. 5 in accordance with an exemplary embodiment. While, in the embodiment shown in FIG. 5, the operating element 40 is rotated from outside the encapsulation, FIG. 16 shows a variant in which the operating element 40 does not extend through the encapsulation 3. In fact, a magnetic drive can be provided, which acts through the encapsulation 3. For this purpose, a permanent magnet 54 can be provided at the lower end of the operating element 40 and can be rotated by an electromagnet or permanent magnet arrangement 55 from outside the encapsulation, for example against the force of a torsion spring. The magnetic field of the magnet arrangement 55 acts through the encapsulation 3 which, for example, is composed of a aluminum.

Corresponding permanent-magnet or electromagnetic arrangements can also be used to produce linear movements or tilting movements.

The electromagnet arrangement 55 can also be arranged within the encapsulation 3.

Figure 6:
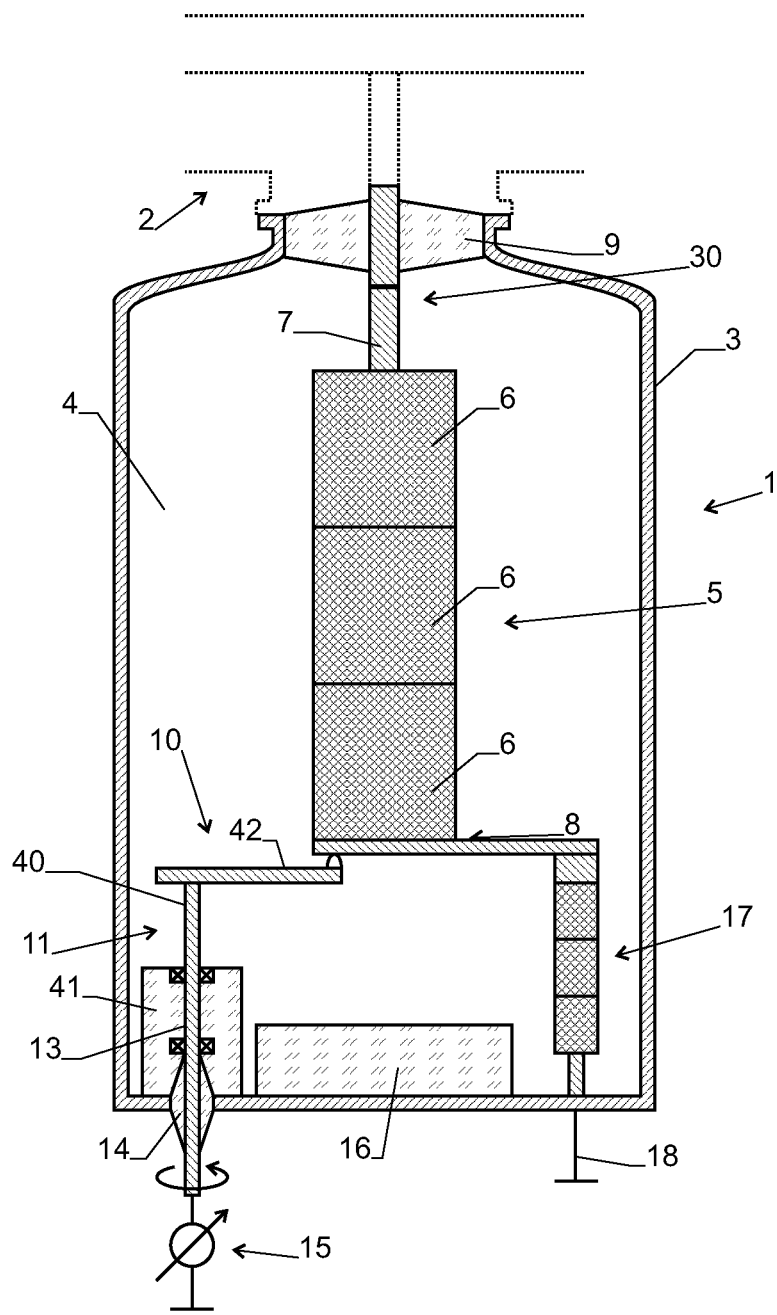
FIG. 6 shows a sixth arrangement of a surge arrester with rotary switch in accordance with an exemplary embodiment.

FIG. 6 shows a sixth arrangement of a surge arrester with rotary switch in accordance with an exemplary embodiment. As is illustrated in FIG. 6, the operating element 40 can also be formed by the metal pin 13. In this case, the rotary bearing 41 can be arranged around the metal pin 13.

Figure 7:
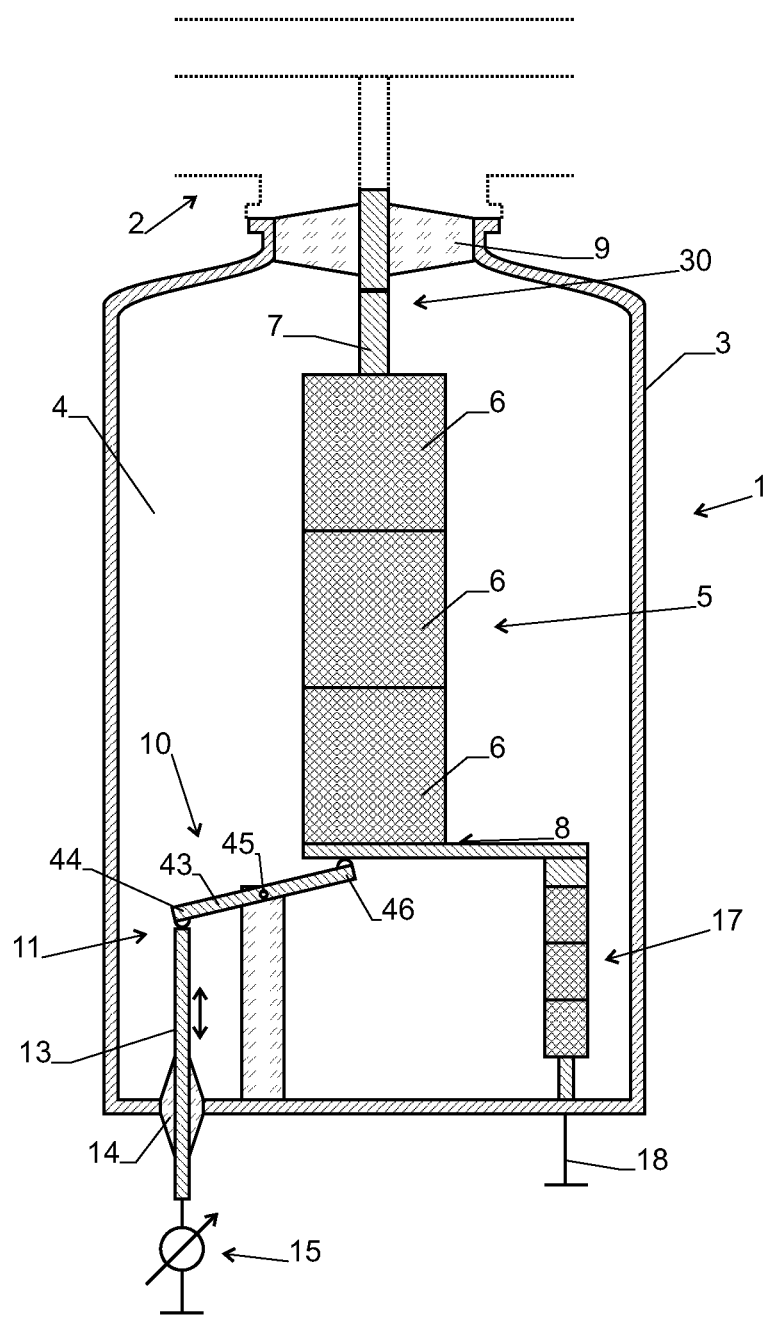
FIG. 7 shows a seventh arrangement of a surge arrester with rocker switch in accordance with an exemplary embodiment.

FIG. 7 shows a seventh arrangement of a surge arrester with rocker switch in accordance with an exemplary embodiment. In the exemplary embodiment shown in FIG. 7, the pivoting arm 42 has been replaced by a tilting arm 43, which can be tilted by a longitudinal movement of the metal pin 13. By way of example, the tilting arm 43 can be connected in an articulated manner to the upper end of the metal pin 13 at a first end 44, and held at its center in a tilting bearing 45, such that its second end 46 is brought into contact with the second connection 8 of the varistor 5, and can be disconnected therefrom, by a longitudinal movement of the metal pin 13.

Figure 8:
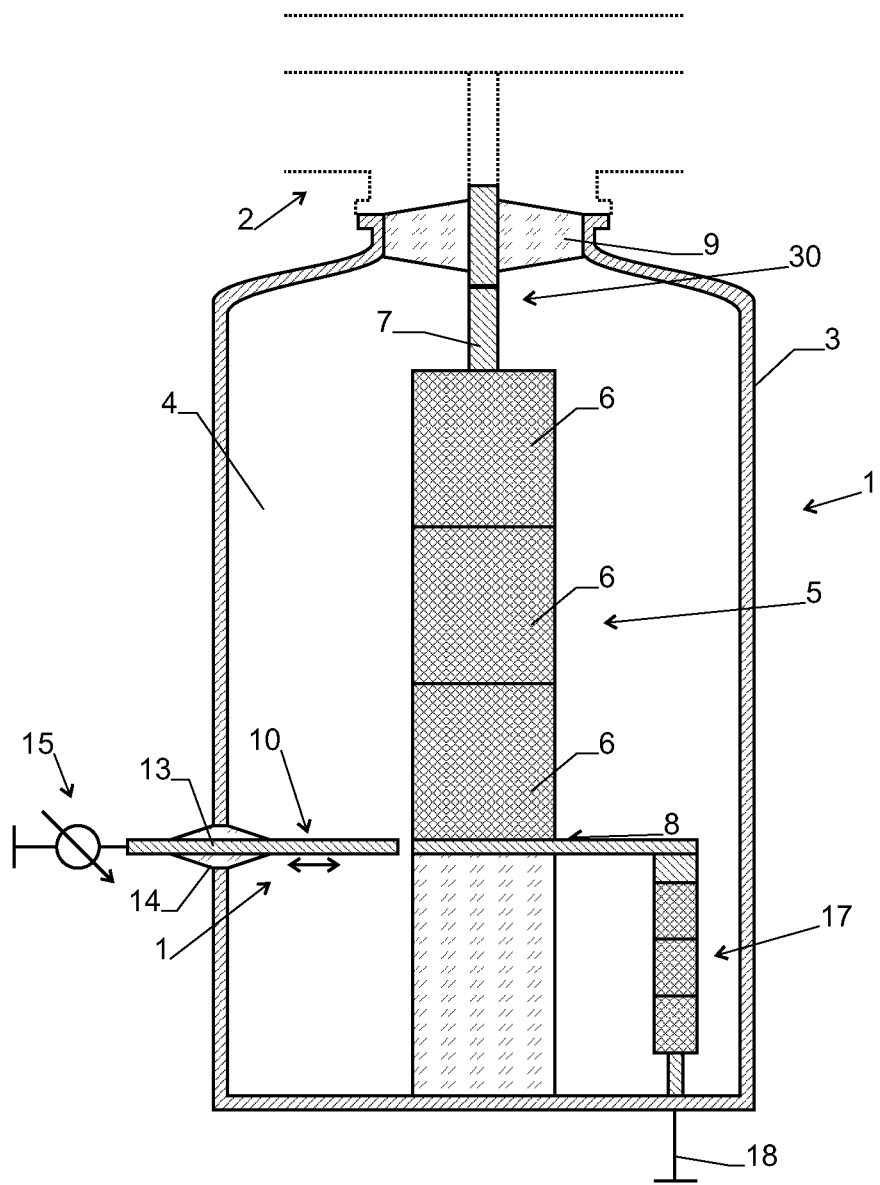
FIG. 8 shows a eight arrangement of a surge arrester with lateral metal pin in accordance with an exemplary embodiment.

FIG. 8 shows a eight arrangement of a surge arrester with lateral metal pin in accordance with an exemplary embodiment. The variant illustrated in FIG. 8 differs from the embodiment shown in FIG. 1 in that the metal pin 13 is guided at the side by the encapsulation 3.

Figure 9:
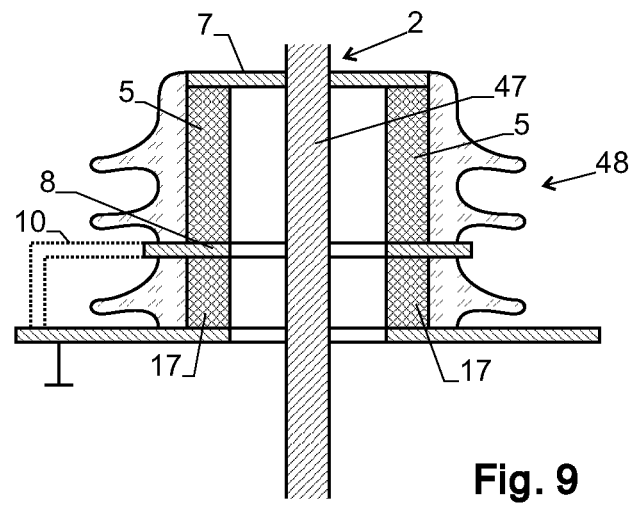
FIG. 9 shows a first arrangement of a surge arrester in a high-voltage bushing in accordance with an exemplary embodiment.

FIG. 9 shows a first arrangement of a surge arrester in a high-voltage bushing in accordance with an exemplary embodiment. FIG. 9 shows a section through a device in the form of a high-voltage bushing 48 with an integrated surge arrester. The high-voltage conductor 47 corresponds to the "circuit arrangement" 2. By way of example, the varistor 5 is arranged in a cylindrical form around the high-voltage conductor 47. The first connection 7 of the varistor 5 forms an annular disk, which extends radially inward as far as the high-voltage conductor 47. The second connection 8 is likewise formed by an annular disk which, during normal operation, is connected to ground via a first line 10 (illustrated by dashed lines in FIG. 9). By way of example, the additional impedance 17 is also arranged in a cylindrical form around the high-voltage conductor 47, and is connected to the second connection 8 on its high-voltage side, and to ground on its ground side.

During normal operation, as mentioned, the second connection 8 is connected to ground via the first line 10. For test operation, the first line 10 is interrupted, for example via a switch or by being removed entirely.

Figure 10:
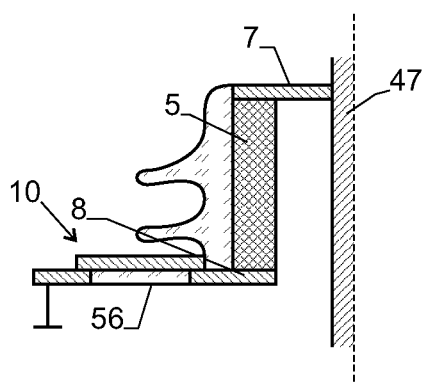
FIG. 10 shows second arrangement of a surge arrester in a high-voltage bushing during normal operation in accordance with an exemplary embodiment.
Figure 11:
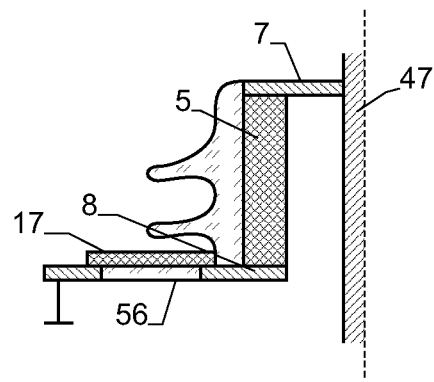
FIG. 11 shows the second arrangement of FIG. 10 during test operation in accordance with an exemplary embodiment.

FIG. 10 shows second arrangement of a surge arrester in a high-voltage bushing during normal operation in accordance with an exemplary embodiment. FIG. 11 shows the second arrangement of FIG. 10 during test operation in accordance with an exemplary embodiment. FIGS. 10 and 11 show a second embodiment of the high-voltage bushing.

In comparison to the embodiment shown in FIG. 9, the additional impedance 17 is arranged radially here, and the housing 3 contains an isolation gap 56. As is indicated in the figures, the additional impedance introduced as an alternative to the grounding line 10 between the second connection 8 and ground.

Figure 12:
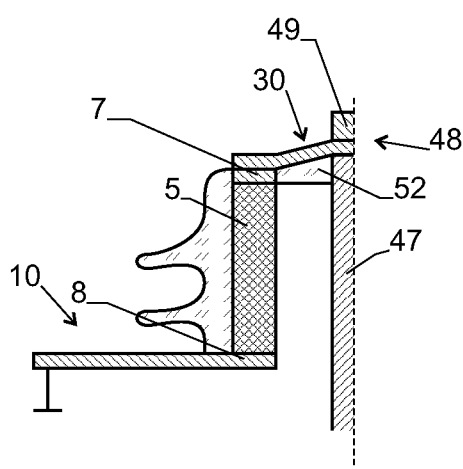
FIG. 12 shows a third arrangement of a surge arrester in a high-voltage bushing during normal operation in accordance with an exemplary embodiment.
Figure 13:
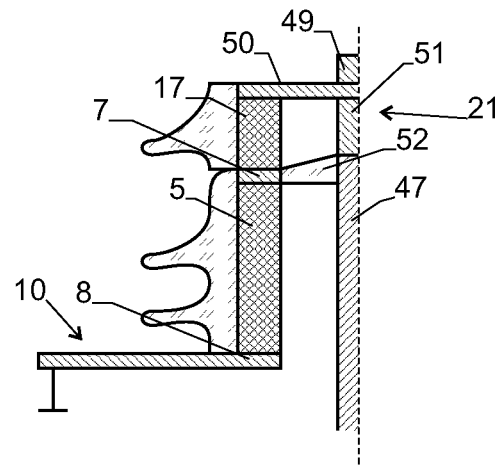
FIG. 13 shows the third arrangement of FIG. 12 during test operation in accordance with an exemplary embodiment.

FIGS. 12 and 13 show a third embodiment of a high-voltage bushing. FIG. 12 shows a third arrangement of a surge arrester in a high-voltage bushing during normal operation in accordance with an exemplary embodiment. FIG. 13 shows the third arrangement of FIG. 12 during test operation in accordance with an exemplary embodiment.

In comparison to the embodiments described above, the additional impedance 17 is in this case arranged between the first connection 7 of the varistor 5 and high voltage during test operation. In principle, this arrangement is suitable not only for bushings but also for all other arrangements.

In the exemplary embodiments shown in FIGS. 12 and 13, the additional impedance 17 can be accommodated in an additional module 21, in a similar manner to that in the embodiment shown in FIG. 3, and is specified only during test operation. The insulating bushing 52 is, for example, in the form of an external cone. During normal operation, the additional module 21 is omitted, and a bridging element 48 is used instead of it, in a similar manner to the grounding element 28 in the embodiment shown in FIG. 3.

In the embodiment shown in FIGS. 12 and 13, the second connection 8 of the varistor 5 is permanently at ground. During normal operation, the first connection 7 is connected to high voltage via the bridging element 48, which forms the first line 30. The bridging element 48 in the present embodiment is in the form of a cap-like attachment to the high-voltage bushing, and forms a mechanical connection 49 for connection of the external line.

In the illustrated embodiment, the bridging element 48 is replaced by the additional module 21 during the test phase, that is to say the first line 30 is interrupted. The first connection 7 is now at high voltage, via the additional impedance 17. For this purpose, the additional module 21 is designed such that the additional impedance 17 comes to rest on the first connection 7, and is connected on its opposite side to the high-voltage line 47 via a radial contact ring 50 and an axial contact bar 51. The additional module 21 forms the mechanical connection 49 for connection of the external line.

In the embodiments shown in FIGS. 9-13, the space between the varistor 5 and the high-voltage conductor 47 can be filled with inert gas or with a protective liquid, or an insulating solid body can be provided at this point. When using a gas-filled or liquid-filled intermediate space, electrically insulating bushings 52 are provided for mechanical robustness and for sealing, see for example FIGS. 12, 13.

FIGS. 14 and 15 show a further high-voltage device 53 with overvoltage protection. FIG. 14 shows a high-voltage device with an integrated surge arrester during the test phase in accordance with an exemplary embodiment. FIG. 15 shows the high-voltage device of FIG. 14 during normal operation in accordance with an exemplary embodiment. This device can, for example, be a transformer.

A varistor 5 can be provided in a known manner as overvoltage protection. During normal operation (FIG. 15), the first connection 7 of the varistor 5 is connected via the first line 30 to a circuit arrangement 2, which is at high voltage, and the second connection 8 is connected to ground via a second line 10.

In the exemplary embodiment of FIG. 15, the second line 10 passes through a grounding element 28, in a similar manner to that in the embodiment shown in FIG. 4, which grounding element 28 is inserted into a depression in the encapsulation 3 of the device. The second line 10 can be interrupted by removing the grounding element 28.

As is shown in FIG. 14, for the test phase the grounding element 28 is replaced by an additional module 21, which is designed approximately in the same way as that shown in FIG. 4, and contains the additional impedance 17.

It should be noted that the embodiments shown in the figures can also be varied in widely differing manners.

For example, in the embodiment shown in FIG. 2, the diameter of the additional impedance 17 can correspond to that of the varistor 5, in which case the second connection can be tapped off at the side, on the varistor, which is now actually longer. This side tap can then, for example, make contact with a metal pin 13 in the manner illustrated in FIG. 1.

Furthermore, it should be noted that the exemplary embodiments disclosed herein are admittedly highly advantageous in conjunction with gas-insulated, liquid-insulated, or solid-insulated components, because no manipulations are specified during tests, which manipulations would necessitate the letting out of inert gas or protective liquid. However, as illustrated with reference to a number of examples above, the exemplary embodiments described herein can also be used for components without gas, liquid or solid insulation.

The exemplary embodiments can also be used particularly advantageously for a plug output conductor which has a plug connection of the type shown in FIG. 4 on the ground side. On the high-voltage side, the plug output conductor forms a tab, corresponding to the tab 33 or 34, and is inserted into a depression in the device which is at high voltage.

If a mechanical switching arrangement is provided, then it is advantageous to use an electromagnet arrangement 55, for example of the type shown in FIG. 16. The use of an electromagnet arrangement for operation of the switching arrangement, which can be used for all the embodiments of the switching arrangement, has the advantage that there is no need for a mechanically movable bushing through the encapsulation 3.

It is furthermore also feasible to provide a movable bellows for the mechanical operation of the switching arrangement in the encapsulation, via which bellows the operation can be carried out. This solution can also be embodied in a completely gas-tight manner.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

Reference Numbers
1: Surge arrester
2: Circuit arrangement
3: Encapsulation
4: Internal area
5: Varistor
6: Individual bodies
7, 8: First and second connection
9: Bushing
10: Second line (ground line)
11: Switching arrangement
12: Conductor section
13: Metal pin
14: Bushing
15: Measurement instrument
16: Insulating body
17: Additional impedance
18: Ground connection
19: Contact mechanism
20: Supporting body
21: Additional module
22: High-voltage bushing
23: Conductor
24: Cap
25: Flange
26: Contact element
27: Insulation means
28: Grounding element
29: Metal plate
30: First line
31: Bushing
32: Depression
33, 34: Tab
35, 36: Insulator
38, 39: Conductor
40: Operating element
41: Rotating bearing
42: Pivoting arm
43: Tilting arm
44: First end of the tilting arm
45: Tilting bearing
46: Second end of the tilting arm
47: High-voltage conductor
48: Bridging element
49: Connection
50: Contact ring
51: Contact bar
52: Bushing
53: High-voltage device
54: Permanent magnet
55: Magnet arrangement
56: Isolation gap

What is claimed is:

1. A device having overvoltage protection for carrying out an overvoltage test in a circuit arrangement to which at least one surge arrestor is connected, comprising:
    a varistor which can be connected to high voltage potential at a first connection and can be connected to ground at a second connection;
    a first line, via which the first connection can be connected to the high voltage potential;
    a second line, via which the second connection can be connected to ground;
    at least one additional impedance, which has a higher impedance than the first or second line and which can be arranged between the first connection and the high voltage, and/or between the second connection and ground;
    a mechanical switching arrangement for interrupting the first or second line during the overvoltage test; and
    an encapsulation that encloses an insulating gas or an insulating liquid, wherein the varistor and the additional impedance are arranged in the encapsulation,
    wherein the switching arrangement has a switch which is arranged in the encapsulation and is operated through the encapsulation, and
    wherein the switch has a moving element which extends through the encapsulation and is held movably in a gas tight bushing.

2. The device as claimed in claim 1, wherein the movable element is electrically conductive and forms part of the first or second line.

3. A device having overvoltage protection for carrying out an overvoltage test in a circuit arrangement to which at least one surge arrestor is connected, comprising:
    a varistor which can be connected to high voltage potential at a first connection and can be connected to ground at a second connection;
    a first line, via which the first connection can be connected to the high voltage potential;
    a second line, via which the second connection can be connected to ground;
    at least one additional impedance, which has a higher impedance than the first or second line and which can be arranged between the first connection and the high voltage, and/or between the second connection and ground;
    a mechanical switching arrangement for interrupting the first or second line during the overvoltage test; and
    an encapsulation that encloses an insulating gas or an insulating liquid, wherein the varistor and the additional impedance are arranged in the encapsulation, wherein the switching arrangement has a switch which is arranged in the encapsulation and is operated through the encapsulation, and wherein the switch has a movable element which is operated by a magnet arrangement.

4. The device as claimed in claim 1, comprising:

an encapsulation that encloses an insulating gas or an insulating liquid in a sealed manner, wherein the varistor is arranged in the encapsulation, and wherein the switching arrangement is arranged outside the encapsulation.

5. A device having overvoltage protection for carrying out an overvoltage test in a circuit arrangement to which at least one surge arrestor is connected, comprising:

a varistor which can be connected to high voltage potential at a first connection and can be connected to ground at a second connection;

a first line, via which the first connection can be connected to the high voltage potential;

a second line, via which the second connection can be connected to ground;

at least one additional impedance, which has a higher impedance than the first or second line and which can be arranged between the first connection and the high voltage, and/or between the second connection and ground;

an encapsulation that encloses an insulating gas or an insulating liquid in a sealed manner, wherein the varistor is arranged in the encapsulation, and wherein the switching arrangement is arranged outside the encapsulation; and an electrically conductive, removable grounding element, arranged between the second connection and ground, or having an electrically conductive, removable bridging element arranged between the first connection and high voltage potential.

6. The device as claimed in claim 5, wherein the grounding element is disposed into a depression or an external contour of the device.

7. The device as claimed in claim 1, comprising:

an encapsulation that encloses an insulating gas or an insulating liquid in a sealed manner, wherein the varistor is arranged in the encapsulation, and wherein the additional impedance is arranged outside the encapsulation.

8. The device as claimed in claim 7, wherein the additional impedance is arranged in an additional module, and wherein the grounding element and/or the bridging element and the additional module are alternatively fitted to the encapsulation.

9. The device as claimed in claim 1, wherein the additional impedance is arranged between the second connection and ground.

10. The device as claimed in claim 1, wherein the additional impedance has a capacitive and/or resistive impedance value.

11. The device as claimed in claim 1, wherein the additional impedance has an impedance value which decreases as the voltage increases.

12. The device as claimed in claim 1, wherein the device is a surge arrester or a bushing.

* * * * *